(12) United States Patent
Baek

(10) Patent No.: US 8,021,944 B2
(45) Date of Patent: Sep. 20, 2011

(54) METHOD FOR FABRICATING SEMICONDUCTOR DEVICE

(75) Inventor: In-Cheol Baek, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 256 days.

(21) Appl. No.: 12/325,166

(22) Filed: Nov. 29, 2008

(65) Prior Publication Data
US 2009/0142901 A1 Jun. 4, 2009

(30) Foreign Application Priority Data
Nov. 30, 2007 (KR) .......................... 10-2007-0123570

(51) Int. Cl.
*H01L 21/8238* (2006.01)
*H01L 21/4763* (2006.01)

(52) U.S. Cl. ........ 438/230; 438/303; 438/649; 438/651; 438/664; 257/757; 257/E21.35; 257/E21.231; 257/E21.636

(58) Field of Classification Search .................. 438/230, 438/283, 303, 649, 651, 664; 257/133, 274, 257/757, E21.35, E21.231, E21.636
See application file for complete search history.

(56) References Cited

U.S. PATENT DOCUMENTS
2009/0146302 A1 * 6/2009 Baek ............................ 257/741

FOREIGN PATENT DOCUMENTS
KR 10-2007-0006052 1/2007
* cited by examiner

*Primary Examiner* — Hsien Ming Lee
(74) *Attorney, Agent, or Firm* — Sherr & Vaughn, PLLC

(57) ABSTRACT

A method for fabricating a semiconductor device is disclosed. The method includes: forming a photoresist film on a semiconductor substrate including a silicide forming region and non-silicide forming region; forming a photoresist pattern as a non-salicide pattern by patterning the photoresist film, so as to cover the non-silicide forming region and open the silicide forming region, with an overhang structure that a bottom is removed more compared to a top; forming a metal film on a top of the photoresist pattern and overall the semiconductor substrate in the silicide forming region; stripping the photoresist pattern and the metal film on the photoresist pattern; and forming a silicide metal film by annealing the metal film remaining on the semiconductor substrate. Therefore, the present invention simplifies a salicide process of a semiconductor device, making it possible to improve yields.

17 Claims, 4 Drawing Sheets

METHOD FOR FABRICATING SEMICONDUCTOR DEVICE

Figure 1:
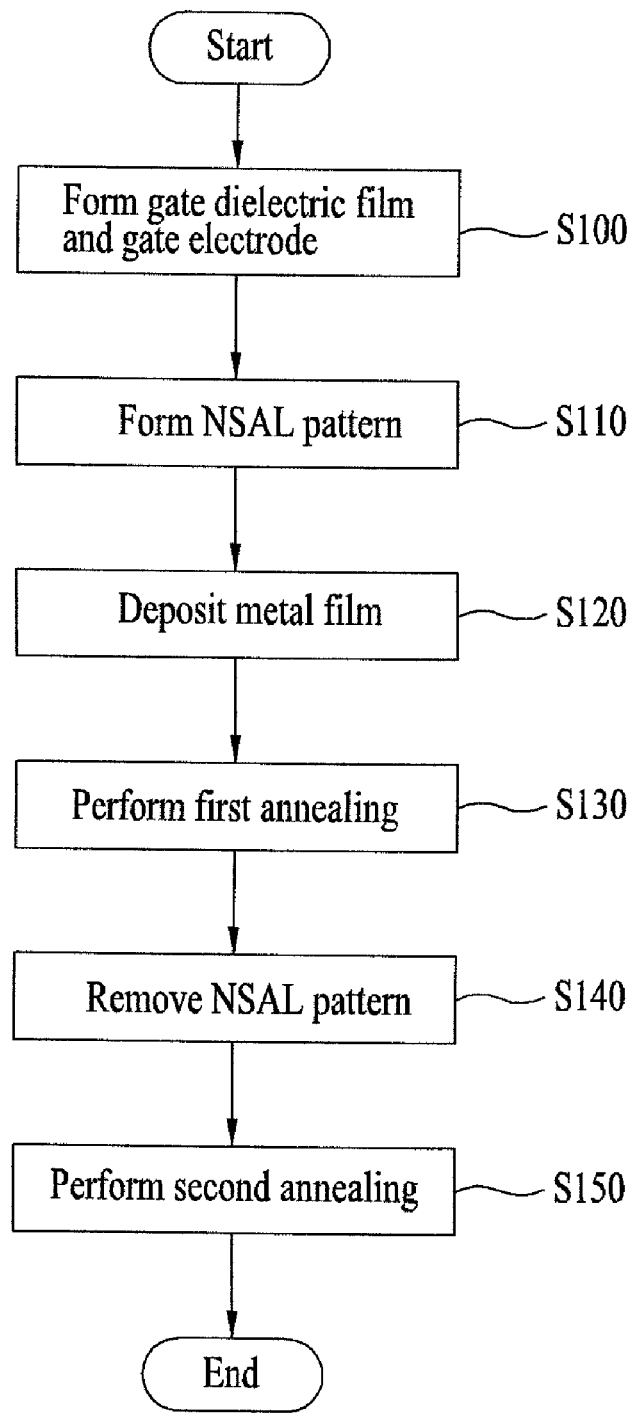

The present application claims priority under 35 U.S.C. §119 to Korean Patent Application No. 10-2007-0123570 (filed on Nov. 30, 2007), which is hereby incorporated by reference in its entirety.

BACKGROUND

In order to promote a thin structure, large capacity and high integration of a semiconductor device, there is currently a demand for an indispensable subsequent process for forming a multilayer wire such as a metal wire which can electrically connect each device, after forming a transistor, a bit line, a capacitor of the semiconductor device. The performance of a transistor is closely related to the speed, drive current and leakage current of the transistor, and in order to maximize the performance of the transistor, the speed and driver current of the transistor must be large and the leakage current must be small. In order to increase the speed and drive current of the transistor while reducing the leakage current of the transistor, resistance of source and drain of the transistor, resistance values of resistance of gate and contact resistance of the transistor must be small.

In order to reduce resistance values of resistance of source and drain of the transistor, resistance of gate, and contact resistance of the transistor, a self-aligned silicide (salicide) process for fabricating silicide on and/or over an interface of the drain and source and an interface of the gate is used. The salicide process is an important process in recent fabrication of a semiconductor device. Generally, silicide is advantageous in low resistance, high thermal stability, and easy application to a current silicon process, such that the silicide has been actively applied to a VLSI wire process. Furthermore, a silicide film formed on and/or over a gate electrode and a junction surface of source and drain can reduce the specific resistance of the gate electrode and contact resistance of the source and drain, respectively, thereby providing an advantage capable of greatly reducing wire resistance. As a material of the silicide, rare earth metals which react with silicon is generally used, for example, tungsten silicide ($WSi_2$), titanium silicide ($TiSi_2$), cobalt silicide ($CoSi_2$) and the like. A salicide barrier film is formed on and/or over a region where salicide is not formed, using an oxide film and the like. The salicide is formed in the process sequence of forming a salicide barrier film after forming a gate, forming a photoresist pattern using a photo process, forming a salicide barrier film pattern by removing an oxide film on and/or over a region where silicide is to be formed, removing the photoresist pattern, depositing a metal film, and forming a silicide using an annealing process. However, in such a salicide process, problems arise in that the process is complicated to extend the process time and to lower yields.

SUMMARY

Embodiments relate to a method for fabricating a semiconductor device that can simplify a salicide process.

In accordance with embodiments, a method for fabricating a semiconductor device may include at least one of the following: forming a photoresist film on and/or over a semiconductor substrate including a silicide forming region and non-silicide forming region; forming a photoresist pattern as a non-salicide pattern by patterning the photoresist film, so as to cover the non-silicide forming region and expose the silicide forming region, with an overhang structure that a bottom is removed more compared to a top; forming a metal film on and/or over the photoresist pattern and the semiconductor substrate in the silicide forming region; stripping the photoresist pattern and the metal film on the photoresist pattern; and forming a silicide metal film by annealing the metal film remaining on and/or over the semiconductor substrate.

In accordance with embodiments, a method for fabricating a semiconductor device may include at least one of the following: providing a semiconductor substrate having a silicide forming region and a non-silicide forming region; and then forming a photoresist film over the silicide forming region and the non-silicide forming region; and then forming a photoresist pattern by patterning the photoresist film over the non-silicide forming region and exposing the silicide forming region, wherein a bottom portion of the photoresist pattern has an overhang structure; and then forming a metal film over the photoresist pattern and the semiconductor substrate in the silicide forming region; and then removing the photoresist pattern and the metal film formed over the photoresist pattern; and then forming a silicide metal film by performing an annealing process on the metal film formed over the semiconductor substrate.

In accordance with embodiments, a method for fabricating a semiconductor device may include at least one of the following: providing a semiconductor substrate having a silicide forming region and a non-silicide forming region; and then forming gate patterns in the silicide forming region and the non-silicide forming region; and then forming spacers over sidewalls of the gate pattern; and then forming a photoresist pattern over the non-silicide forming region, wherein a bottom sidewall portion of the photoresist pattern is slanted at an angle with respect to an upper sidewall portion of the photoresist pattern; and then forming a metal film over the semiconductor substrate in the silicide forming region including the gate pattern and the spacers and also in the non-silicide forming region including the uppermost surface of the photoresist pattern and the upper sidewall portion of the photoresist pattern and not the bottom sidewall portion of the photoresist pattern; and then forming a pre-silicide film on the metal film in the silicide forming region by performing a first annealing process; and then removing the photoresist pattern including the metal film formed in the non-silicide forming region; and then forming a silicide metal film by performing a second annealing process on the pre-silicide film formed over the gate pattern and the semiconductor substrate in the silicide forming region.

In accordance with embodiments, a method for fabricating a semiconductor device may include at least one of the following: providing a semiconductor substrate having a silicide forming region and a non-silicide forming region; and then forming a transistor in the silicide forming region and the non-silicide forming region; and then forming a photoresist pattern over the non-silicide forming region such that a bottom sidewall portion of the photoresist pattern is slanted at an angle with respect to an upper sidewall portion of the photoresist pattern; and then forming a metal film over the semiconductor substrate in the silicide forming region including the transistor and also in the non-silicide forming region including the entire photoresist pattern except the bottom sidewall portion; and then removing the photoresist pattern including the metal film formed in the non-silicide forming region; and then forming a silicide metal film over the transistor by performing an annealing process.

DRAWINGS

Example FIGS. 1 to 7 illustrate a method for fabricating a semiconductor device in accordance with embodiments.

DESCRIPTION

Example FIG. 1 is a flowchart explaining a method for fabricating a semiconductor device and example FIGS. 2 to 7 are cross-sectional views showing processes of a method for fabricating a semiconductor device in accordance with embodiments.

Figure 2:
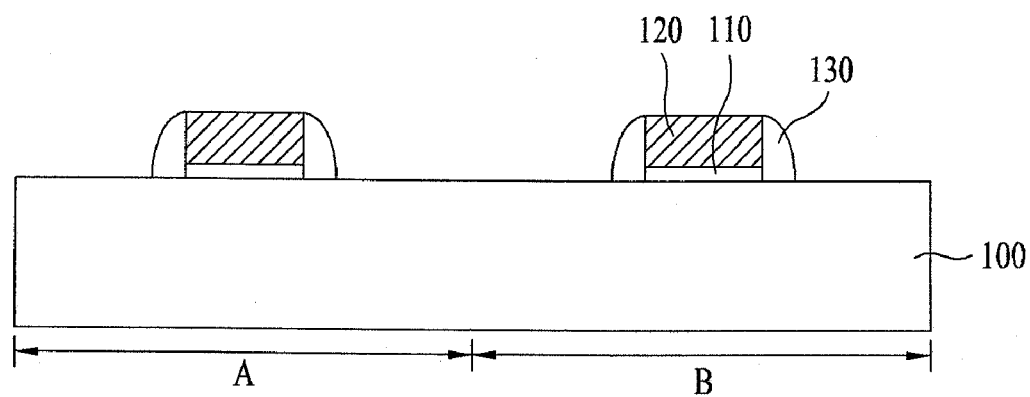

Referring to example FIGS. 1 and 2, in S100, a gate dielectric film 110 is formed on and/or over a semiconductor substrate 100 including a silicide forming region B and a non-silicide forming region A and a gate electrode 120 is formed on and/or over the gate dielectric film 110. Spacers 130 are formed on and/or over side walls of the gate electrode 120 and the gate dielectric film 110 to protect the side walls of the gate electrode 120. Source/drain regions may also be formed in the semiconductor substrate 100 at both sides of the gate electrode 120 by ion-implanting a high-concentration n-type or p-type impurity thereto.

Figure 3:
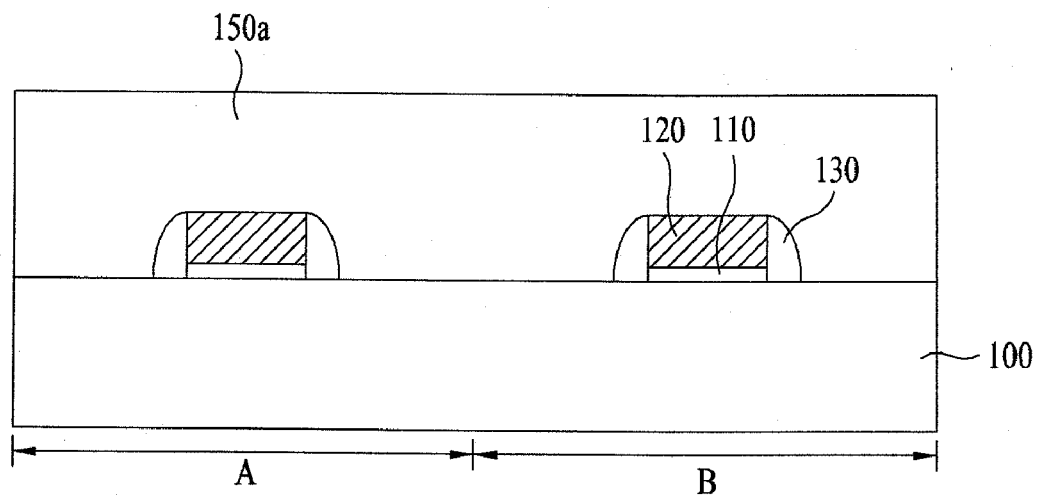
Figure 4:
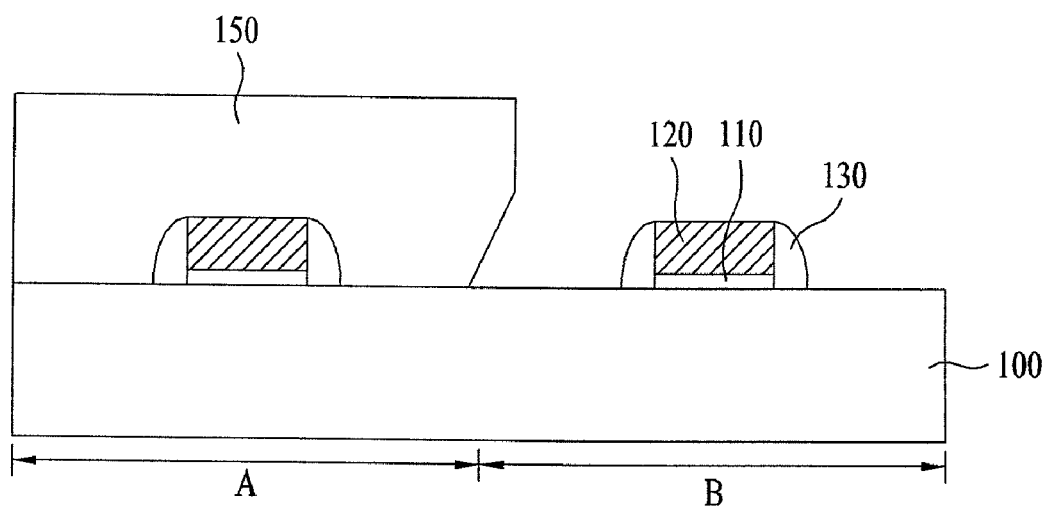

Thereafter, as shown in example FIGS. 3 and 4, in S110, a non-salicide (NSAL) pattern is formed on and/or over the entire semiconductor substrate 100 including the gate electrode 110 and spacers 130. As shown in example FIG. 3, a photoresist film 150a is formed over the semiconductor substrate 100 including the gate electrode 110 and spacers 130. The photoresist film 150a may be formed of a positive photoresist film or a negative photoresist film.

Hereinafter, embodiments will be described based on the negative photoresist film, however, the same principle may also be applied to the positive photoresist film. The positive photoresist film has the property that a cross-link in an exposed portion is broken to be removed by development, and the negative photoresist film has the property that a cross-link in an exposed portion is firmly coupled not to be removed by developer. After a soft bake process is performed on the photoresist film 150a, the non-silicide forming region A is selectively exposed by the photoresist film 150a using a mask. In other words, the mask allows light to be transmitted to the non-silicide forming region A of the photoresist film 150a and not to be transmitted to the silicide forming region B of the photoresist film 150a. At this time, the exposure is performed using exposure energy greater than exposure energy generally used in a photo process. Thereafter, the surface of the photoresist film 150a in the exposed non-silicide forming region A is cured by performing a monochloro benzene (MCB) process so as not to react with the developer. The MCB process refers to a process to dip the semiconductor substrate in the MCB solution and the process time is in a range between approximately 5 to 10 minutes. If the photoresist film 150a processed as above is developed, a photoresist pattern 150 from which the photoresist film 150a in the non-exposed silicide forming region B is removed is formed as shown in example FIG. 4.

Finally, as shown in example FIG. 4, the photoresist film 150a is removed from the silicide forming region B of the semiconductor substrate 100, and the photoresist pattern 150 remains in the non-silicide forming region A. The remaining photoresist pattern 150 corresponds to a non-salicide (NSAL) pattern. Also, the photoresist pattern 150 has an overhang structure such that a bottom portion thereof is removed. Meaning, a critical dimension (CD) of the upper portion of the photoresist pattern 150 is larger than a CD of the bottom portion of the photoresist pattern 150. The overhang structure is important insofar as the photoresist film 150a in the non-silicide forming region A is selectively exposed using exposure energy greater than exposure energy used in a general photo process and the MCB process is performed on and/or over the surface of the exposed photoresist film 150a. Therefore, the upper portion of the photoresist film 150a in the exposed non-silicide forming region A has the firmly coupled cross-link, whereas the bottom portion thereof does not have such a cross-link.

Figure 5:
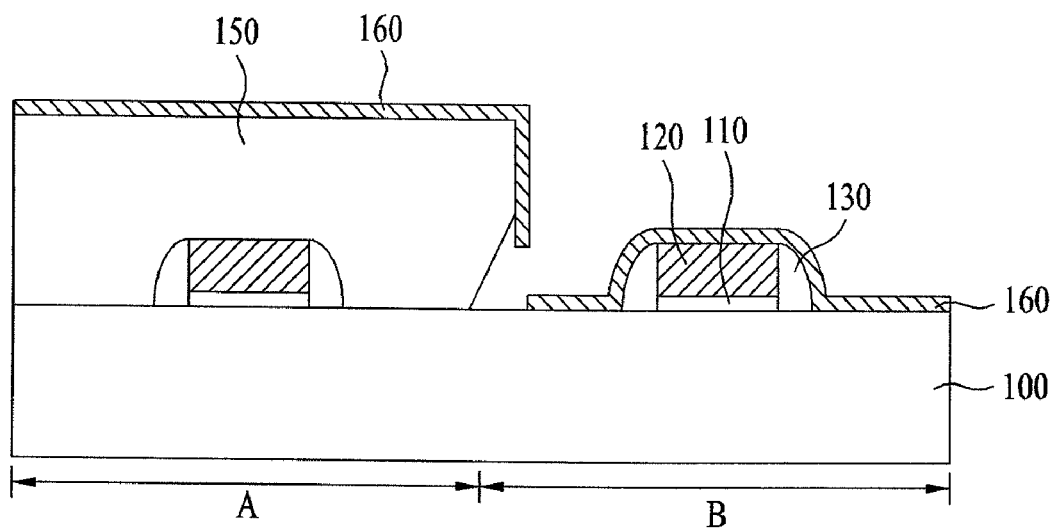

Thereafter, as shown in example FIGS. 1 and 5, in S120, a metal film 160 is deposited on and/or over the semiconductor substrate 100 in the non-silicide forming region A and the silicide forming region B including the photoresist pattern 150 having the overhang structure. The metal film 160 may include at least one of cobalt (Co), titanium (Ti) and titanium nitride (TiN), and may form the metal film 160 as a multi-layer by forming a Ti film on and/or over the Co film and then forming a TiN film on and/or over the Ti film. The Co film, Ti film and TiN film may be formed at a thickness in a range between approximately 10 to 20 nm, respectively. The Ti film and TiN film has two roles. If an oxide film $SiO_2$ is formed on and/or over a surface of a silicon substrate 100, silicide is not formed. Therefore, the Ti film serves to remove the oxide film formed on and/or over the surface of the silicon substrate 100 by reacting with the oxide of the oxide film formed on and/or over the surface of the silicon substrate 100, and assist a silicide to be properly and uniformly formed by reacting the Co film with the silicon substrate 100. Also, the Ti film functions as a capping layer which serves to prevent the oxidation of the surface of a region where silicide is to be formed when the silicon substrate 100 is exposed to air in order to perform an annealing process after depositing the multi-layered Co/Ti/TiN film. The deposition temperature of the metal film 160 may be in a range between approximately 100 to 200° C.

The metal film 160 is formed on and/or over the photoresist pattern 150 and is also formed on and/or over the semiconductor substrate 100 in the silicide forming region B, for example, the uppermost surface of the source/drain regions, the spacer 130 and the gate electrode 120. Since the photoresist pattern 150 is formed having an overhang structure, a portion of the metal film 160 is cut on a bottom side wall of the photoresist pattern 150 as shown in example FIG. 5. Meaning, the metal film 160 is not formed on and/or over the lower, angled portion of the photoresist pattern 150. In S130, a first annealing process may then be performed on the semiconductor substrate 100 on which the metal film 160 is formed. The first annealing temperature is in a range between approximately 400 to 500° C., and a pre-silicide film, for example, CoSi, is thereby formed due to the first annealing process.

Figure 6:
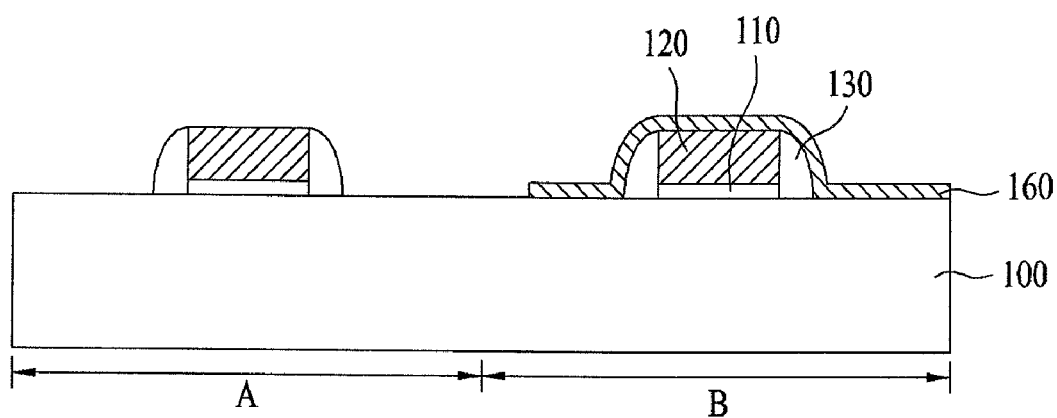

Thereafter, as shown in example FIGS. 1 and 6, in S140, the photoresist pattern 150 is stripped. Since a portion of the metal film 160 is not formed on and/or over the bottom side wall of the photoresist pattern 150, stripper material infiltrates into the gap so that the photoresist pattern 150 may be removed. Also, the portion of the metal film 160 formed on and/or over the photoresist pattern 150 may also be detached and removed. Thereby, the metal film 160 remains only on and/or over the semiconductor substrate 100 in the silicide forming region B, spacer 130 and gate electrode 120.

Figure 7:
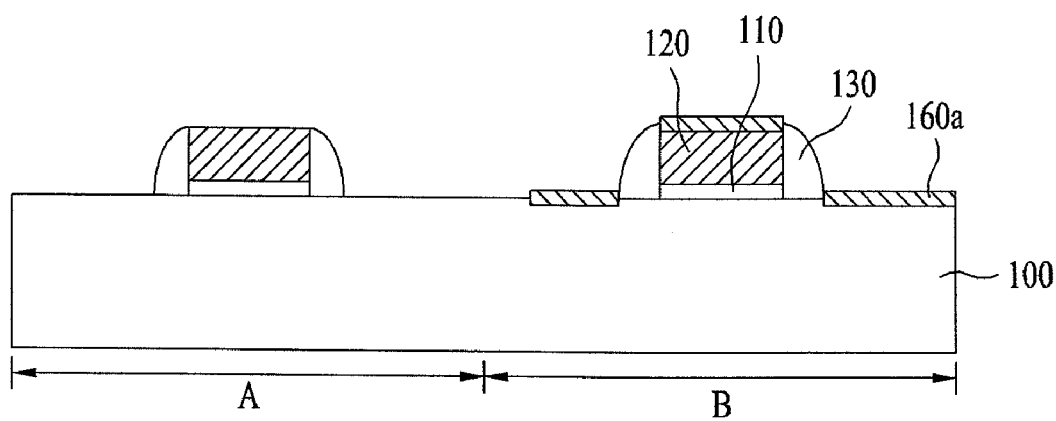

Thereafter, as shown in example FIGS. 1 and 7, in S150, a second annealing process is performed on the semiconductor substrate 100. The second annealing temperature is more than 800° C. Then, except for the metal film 160 formed on and/or over the upper surface of the spacer 130, the metal film 160 formed on and/or over the semiconductor substrate 100 and the gate electrode 120 undergoes a silicide reaction to be formed as a silicide metal film 160a. For example, the CoSi formed after the first annealing becomes $CoSi_2$ to be formed as a silicide film 160a. Thereafter, an etching process may be performed to remove the metal film 150a formed on and/or over the upper surface of the spacer 130, not selectively salicided, as shown in example FIG. 7. Thereby, the silicide metal film 160a may be selectively formed on and/or over the uppermost surface of the gate electrode 120 and the source/drain region in the silicide forming region B of the semiconductor substrate 100. Thereafter, a cleaning process is performed on the semiconductor substrate 100 to complete the salicide process.

In accordance with embodiments, a method for fabricating a semiconductor device simplifies a salicide process of a semiconductor device, thereby making it possible to maximize yields. For example, the method for fabricating a semiconductor device in accordance with embodiments can simply form silicide using a photoresist pattern as a salicide barrier pattern, making it possible to shorten the process time.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   providing a semiconductor substrate having a silicide forming region and a non-silicide forming region; and then
   forming a photoresist film over the silicide forming region and the non-silicide forming region; and then
   forming a photoresist pattern by patterning the photoresist film over the non-silicide forming region and exposing the silicide forming region, wherein a bottom portion of the photoresist pattern has an overhang structure; and then
   forming a metal film over the photoresist pattern and the semiconductor substrate in the silicide forming region; and then
   removing the photoresist pattern and the metal film formed over the photoresist pattern in the non-silicide forming region; and then
   forming a silicide metal film by performing a first annealing process on the metal film formed over the semiconductor substrate,
   wherein forming the photoresist pattern comprises:
   exposing the non-silicide forming region over the photoresist film; and then
   forming the photoresist pattern such that the critical dimension (CD) at the upper portion thereof is greater than the CD at the bottom portion thereof by developing the photoresist film.

2. The method of claim 1, wherein forming the photoresist pattern further comprises:
   exposing a portion of the photoresist film; and then
   after exposing the portion of the photoresist film, performing a mono-chloro benzene (MCB) process on the surface of the exposed photoresist film.

3. The method of claim 1, wherein the metal film includes at least one of cobalt, titanium, and titanium nitride.

4. The method of claim 1, wherein the metal film comprises a multi-layered structure including a cobalt layer, a titanium layer, and a titanium nitride layer stacked in sequence.

5. The method of claim 1, wherein the metal film has a gap formed at a bottom sidewall of the photoresist pattern.

6. The method of claim 1, further comprising, before removing the metal film: forming a pre-silicide film by performing a second annealing process where the metal film is formed.

7. The method of claim 6, wherein the second annealing process is performed at a temperature in a range between approximately 400 to 500° C.

8. The method of claim 1, wherein the first annealing process is performed at a temperature in a range between approximately 800 to 850° C.

9. The method of claim 1, wherein the thickness of the metal film is in a range between approximately 10 nm to 60 nm.

10. The method of claim 1, further comprising, before forming the photoresist film:
    sequentially forming a gate dielectric film and a gate electrode over the semiconductor substrate in the silicide forming region; and then
    forming spacers at sidewalls of the gate dielectric film and the gate electrode; and then
    forming source/drain regions in the semiconductor substrate at sides of the gate electrode,
    wherein the metal film is formed over the uppermost surface of the gate electrode, the spacers, and the source/drain regions.

11. A method comprising:
    providing a semiconductor substrate having a silicide forming region and a non-silicide forming region; and then
    forming gate patterns in the silicide forming region and the non-silicide forming region; and then
    forming spacers over sidewalls of the gate patterns; and then
    forming a photoresist pattern over the non-silicide forming region, wherein a bottom sidewall portion of the photoresist pattern is slanted at an angle with respect to an upper sidewall portion of the photoresist pattern; and then
    forming a metal film over the semiconductor substrate in the silicide forming region including the gate patterns and the spacers and also in the non-silicide forming region including the uppermost surface of the photoresist pattern and the upper sidewall portion of the photoresist pattern and not the bottom sidewall portion of the photoresist pattern; and then
    forming a pre-silicide film on the metal film in the silicide forming region by performing a first annealing process; and then
    removing the photoresist pattern including the metal film formed in the non-silicide forming region; and then
    forming a silicide metal film by performing a second annealing process on the pre-silicide film formed over the gate patterns and the semiconductor substrate in the silicide forming region.

12. The method of claim 11, wherein the pre-silicide film comprises CoSi.

13. The method of claim 11, further comprising, after forming the silicide metal film:
    removing the pre-silicide film formed over the spacers; and then
    performing a cleaning process on the entire semiconductor substrate.

14. The method of claim 11, wherein the first annealing process is performed at a temperature in a range between approximately 400 to 500° C.

15. The method of claim 11, wherein the second annealing process is performed at a temperature in a range between approximately 800 to 850° C.

16. The method of claim 11, wherein the metal film comprises at least one of cobalt, titanium, and titanium nitride.

17. The method of claim 11, wherein the metal film comprises a multi-layered structure including a cobalt layer, a titanium layer, and a titanium nitride layer stacked in sequence.

* * * * *